(12) United States Patent
Woo-Seock (10) Patent No.: US 6,713,387 B2
(45) Date of Patent: Mar. 30, 2004

(54) METHOD FOR FORMING CONTACT PLUG IN SEMICONDUCTOR DEVICE

(75) Inventor: Cheong Woo-Seock, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/329,698

(22) Filed: Dec. 27, 2002

(65) Prior Publication Data

US 2003/0186525 A1 Oct. 2, 2003

(30) Foreign Application Priority Data

Mar. 30, 2002 (KR) .................. 10-2002-0017664

(51) Int. Cl.$^7$ .............................................. H01L 21/44
(52) U.S. Cl. ...................... 438/672; 438/666; 438/675; 438/677; 438/906
(58) Field of Search ................. 438/672, 629, 438/637, 639, 666, 675, 906, 974, 677; 423/348

(56) References Cited

U.S. PATENT DOCUMENTS

| 5,994,211 A | 11/1999 | Wang et al. |
| 6,204,550 B1 | 3/2001 | Wang et al. |
| 6,245,311 B1 * | 6/2001 | Kobayashi et al. ......... 423/348 |
| 6,329,291 B1 | 12/2001 | Wang et al. |
| 6,514,876 B1 * | 2/2003 | Thakur et al. .............. 438/632 |
| 6,586,293 B1 * | 7/2003 | Hasegawa ................... 438/216 |

FOREIGN PATENT DOCUMENTS

KR  2002-1417  1/2002

* cited by examiner

Primary Examiner—Kevin M. Picardat
(74) Attorney, Agent, or Firm—Jacobson Holman PLLC (57) ABSTRACT

The present invention provides a method for forming a contact plug in a semiconductor device capable of preventing a decrease of contact resistance and degradation of device properties due to external diffusions of boron. There suggested two different approaches to suppress regenerations of a native oxide layer so to minimize the contact resistance and to suppress the external diffusions of boron. The first approach includes the steps of forming a contact hole by etching an insulating (BPSG) layer containing boron and phosphorus and subsequently cleaning with a hydrogen-rapid thermal process ($H_2$-RTP) as flowing PH3 gas containing phosphorus. Another approach includes the step of cleaning with the $H_2$-RTP and simultaneously flowing HCl gas from a peak temperature of the H2-RTP.

12 Claims, 8 Drawing Sheets

| Temp.(°C) | Oxygen Fraction | | | | | | | |
|---|---|---|---|---|---|---|---|---|
| | 1ppm | | | | 1ppb | | | |
| | 10Torr | 1Torr | 0.1Torr | 0.01Torr | 10Torr | 1Torr | 0.1Torr | 0.01Torr |
| 700 | 2.49E-12 | 2.49E-11 | 2.49E-10 | 2.49E-09 | 1.39E-09 | 6.13E-09 | 2.14E-08 | 6.96E-08 |
| 720 | 9.90E-12 | 9.90E-11 | 9.90E-10 | 9.85E-09 | 3.47E-09 | 1.31E-08 | 4.35E-08 | 1.40E-07 |
| 740 | 3.72E-11 | 3.72E-10 | 3.71E-09 | 3.65E-08 | 7.59E-09 | 2.63E-08 | 8.53E-08 | 2.72E-07 |
| 760 | 1.33E-10 | 1.33E-09 | 1.32E-08 | 1.25E-07 | 1.52E-08 | 5.05E-08 | 1.62E-07 | 5.14E-07 |
| 780 | 4.51E-10 | 4.50E-09 | 4.41E-08 | 3.79E-07 | 2.90E-08 | 9.40E-08 | 2.99E-07 | 9.48E-07 |
| 800 | 1.46E-09 | 1.45E-08 | 1.37E-07 | 9.80E-07 | 5.30E-08 | 1.70E-07 | 5.39E-07 | 1.71E-06 |
| 820 | 4.50E-09 | 4.42E-08 | 3.79E-07 | 2.17E-06 | 9.40E-08 | 2.99E-07 | 9.49E-07 | 3.00E-06 |
| 840 | 1.33E-08 | 1.26E-07 | 9.16E-07 | 4.27E-06 | 1.62E-07 | 5.16E-07 | 1.63E-06 | 5.17E-06 |
| 860 | 3.73E-08 | 3.27E-07 | 1.93E-06 | 7.78E-06 | 2.75E-07 | 8.71E-07 | 2.76E-06 | 8.72E-06 |
| 880 | 9.94E-08 | 7.57E-07 | 3.68E-06 | 1.38E-05 | 4.56E-07 | 1.44E-06 | 4.57E-06 | 1.44E-05 |
| 900 | 2.46E-07 | 1.55E-06 | 6.50E-06 | 2.25E-05 | 7.42E-07 | 2.35E-06 | 7.43E-06 | 2.35E-05 |

METHOD FOR FORMING CONTACT PLUG IN SEMICONDUCTOR DEVICE

FIELD OF THE INVENTION

The present invention relates to a method for fabricating a semiconductor device; and, more particularly, to a method for forming a contact plug with a silicon thin film in a semiconductor device.

DESCRIPTION OF RELATED ARTS

Recently, the size of a contact plug decreases as a level of integration of a semiconductor device progressively advances. Due to this decreased size of the contact plug, contact resistance of a typically used silicon plug conversely increases. Especially, an oxide formed at an interface of the contact plug is one of causes for increasing the contact resistance of the silicon plug with multi-crystals. Hence, a cleaning process is applied to remove the oxide in order to reduce the contact resistance of the silicon plug with multi-crystals.

However, in case of removing an oxide layer by cleaning a semiconductive substrate through an ex-situ cleaning process, a native oxide layer is formed while the semiconductive substrate completed with the ex-situ cleaning process is loaded to deposition equipment. For this reason, it is impossible to remove completely the oxide layer formed at the interface of the contact plug. Therefore, if the size of the contact plug decreases with a state that the native oxide layer still exists, the contact resistance increases in more extents. Accordingly, an in-situ cleaning process should be used in order to maximally suppress the generation of the native oxide layer.

A conventional polysilicon plug process is mostly carried out in a tube-type deposition equipment or a single wafer-type deposition equipment.

In case of forming the contact plug by depositing a silicon thin film through the tube-type deposition equipment, it is possible for the silicon thin film to obtain a good step coverage property but impossible to perform the in-situ cleaning process. Hence, the silicon thin film is inevitably deposited after performing the ex-situ cleaning process. However, the native oxide layer is formed at a procedure of loading a wafer to the tube-type deposition equipment for depositing the silicon thin film.

Since the singe wafer-type deposition equipment have a cleaning function, it is possible to perform the in-situ cleaning process and deposit the silicon thin film under this in-situ environment, thereby preventing the native oxide layer from being generated.

As mentioned the above, if the contact plug is formed in the single wafer-type deposition equipment, it is possible to remove the native oxide layer formed at the interface of the contact plug by applying a bake or a rapid thermal process (RTP) in an atmosphere of hydrogen or a cleaning process. However, compared to use of the tube-type deposition equipment, such characteristics as uniformity and step coverage become poor when the contact plug size is smaller. In particular, a level of uniformity in the contact resistance decreases.

Also, because of the reduced contact size and increase of an aspect ratio, a sufficient gap-fill should be proceeded by depositing the silicon. However, the single wafer-type deposition equipment has poor gap-fill ability, compared to the tube-type deposition equipment.

In case of forming a contact hole by etching a typical BPSG layer, a cleaning process with a hydrogen-rapid annealing is suggested for removing the native oxide layer. However, when the cleaning process with the hydrogen-rapid annealing is proceeded in a state of the exposed BPSG, it is unable to prevent degradations of device properties and the decrease of the contact resistance due to externally diffused boron.

Figure 1:
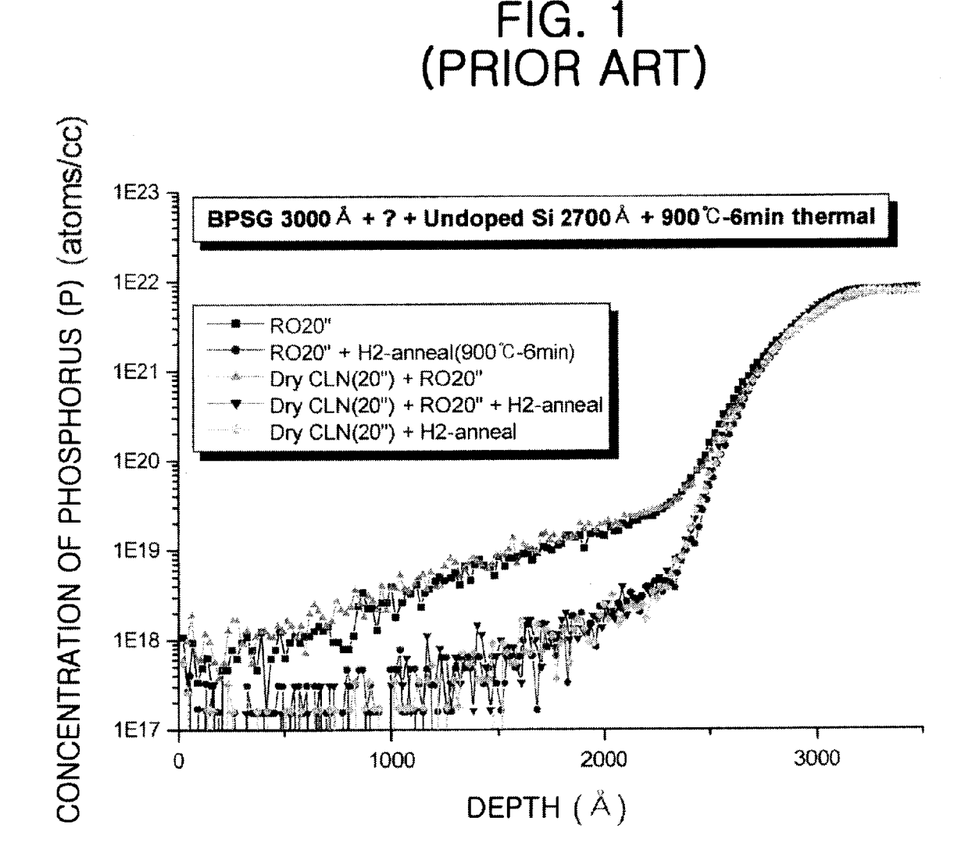
FIG. 1 is a diagram evaluating concentrations of phosphorus (p) diffused from a boro-phospho-silicate glass (BPSG) layer.

FIG. 1 is a diagram evaluating concentrations of phosphorus diffused from a boro-phospho-silicate glass (BPSG) layer.

Referring to FIG. 1, a barrier layer is formed on a surface of the BPSG layer through a dry cleaning process (shortly abbreviated as Dry CLN in FIG. 1) or a hydrogen-thermal annealing process (shortly abbreviated as $H_2$-anneal in FIG. 1). This formation of the barrier layer means that extensive external diffusions of boron occur during an initial stage of the process.

Since the BPSG layer from which boron is externally diffused can be hardened, the typical hydrogen-annealing process including the hydrogen-rapid thermal process is unable to prevent the external diffusions of boron from the BPSG layer during an initial stage of the process.

SUMMARY OF THE INVENTION

It is, therefore, an object of the present invention to provide a method for forming a contact plug in a semiconductor device capable of preventing a decrease of contact resistance and degradation of device properties due to external diffusions of boron within an inter-layer insulating layer.

In accordance with an aspect of the present invention, there is provided a method for forming a contact plug in a semiconductor device, comprising the steps of: forming a contact hole by etching an insulating layer on a substrate; cleaning the contact hole by employing a hydrogen-rapid thermal process ($H_2$-RTP) with flowing a gas containing phosphorus; and filling the contact hole with a silicon layer.

In particular, the step of cleaning the contact hole by employing the $H_2$-RTP is proceeded by cooling a temperature that has been rise instantaneously up to a range between about 900° C. and 950° C. with a heating rate ranging from about 10° C. per second to about 100° C. per second in an atmosphere of H2. Also, the gas containing phosphorus includes a $PH_3$ gas diluted in $H_2$ gas with a ratio of about 1% to 10%. Furthermore, the $PH_3$ gas is flowed with a quantity ranging from about 30 sccm to about 500 sccm up to a temperature ranging between about 900° C. and about 950° C.

In accordance with another aspect of the present invention, there is provided a method forming a contact plug in a semiconductor device, comprising the steps of: forming a contact hole by etching an insulating layer on a substrate; cleaning the contact hole with a hydrogen-rapid thermal process ($H_2$-RTP) and simultaneously flowing HCl gas from a peak temperature of the $H_2$-RTP; and forming a silicon thin layer on the substrate until filling the cleaned contact hole.

The HCl gas is flowed with a quantity ranging from about 50 sccm to about 500 sccm.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

The present invention provides a method for preventing a decrease of contact resistance and degradation of device properties due to external diffusions of boron in a structure including a boro-phospho silicate glass (hereinafter referred as to BPSG) layer as an isolation layer between plugs particularly when performing a hydrogen-rapid thermal cleaning process after forming a contact hole.

The hydrogen-rapid thermal cleaning process can induce a thermodynamically optimized condition.

Figure 2A:
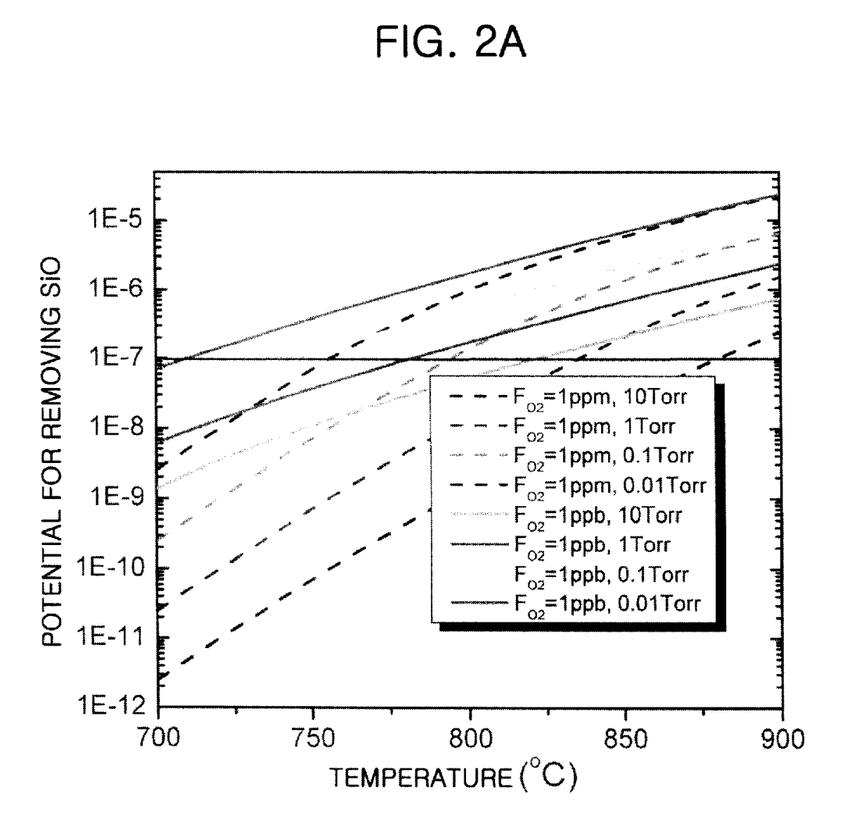
FIG. 2A is a graph illustrating a potential for removing Si—O in accordance with a temperature.

FIG. 2A is a graph showing a potential for removing Si—O in accordance with a temperature.

Referring to FIG. 2A, $SiO_2$ is removed in a form of SiO through a reduction reaction by hydrogen. An initial hydrogen bake is proceeded at a temperature around 900° C. for about 1 minute to about 5 minutes. Herein, the hydrogen bake is a cleaning process proceeded for a certain time at a high temperature. The reduction reaction occurs in a condition with a pressure ranging from about 10 torr to about 100 torr and hydrogen of which flow quantity ranges from about 5 slm to about 150 slm in the oxygen fraction $F_{O2}$.

Figure 2B:
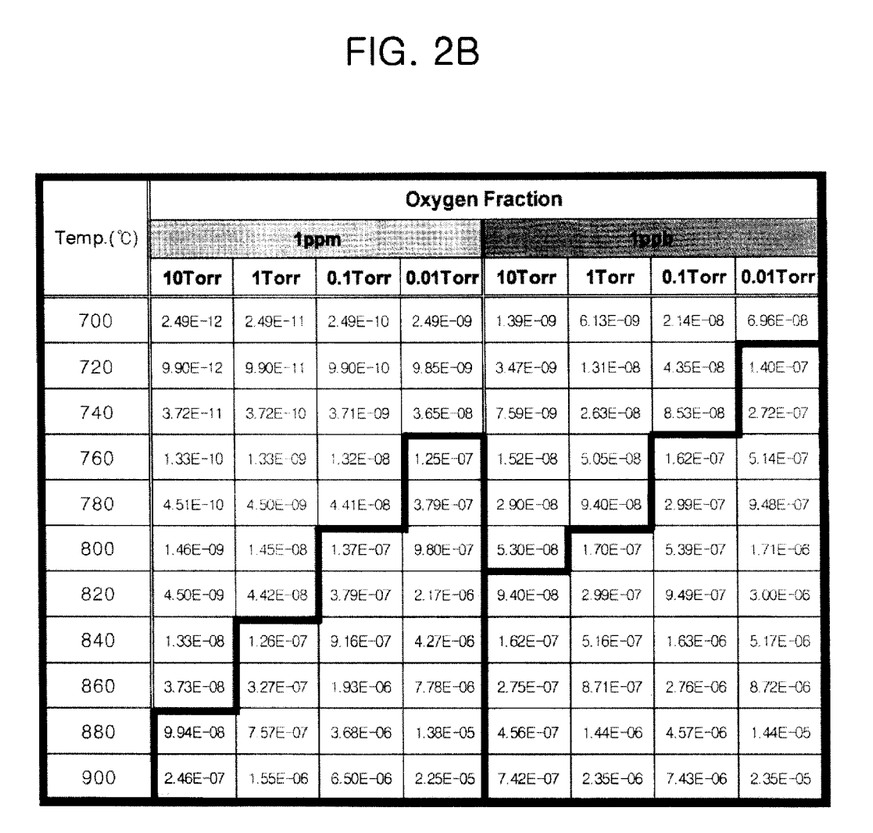
FIG. 2B is a diagram showing oxygen fractions of FIG. 2A.

In FIG. 2B, process recipes change in accordance with a temperature, a pressure and amounts of oxygen impurity. In order to lower a temperature for the cleaning process, hydrogen with high purity is applied under a low pressure.

Figure 3A:
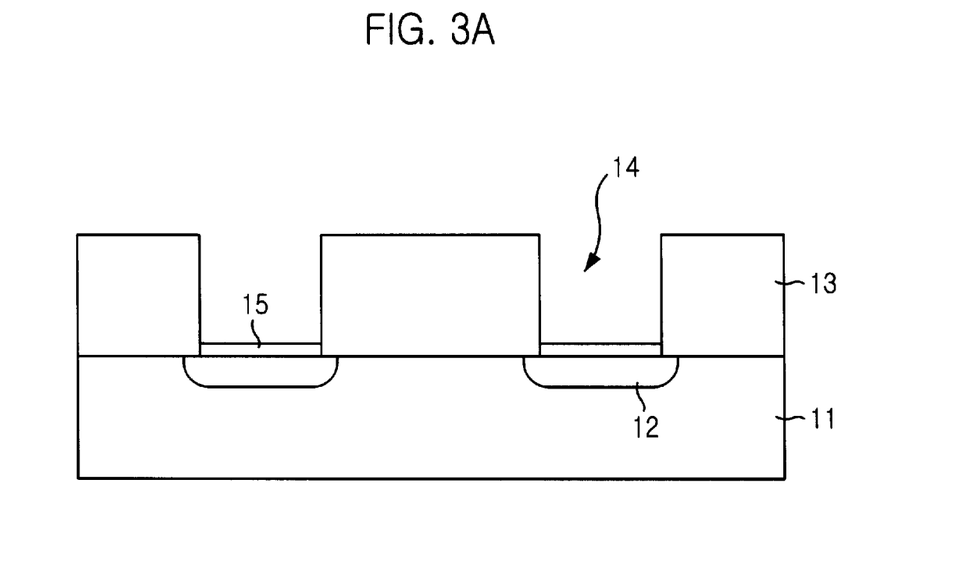
FIGS. 3A to 3C are cross-sectional views illustrating a method for forming a contact plug in accordance with a first embodiment of the present invention.
Figure 3B:
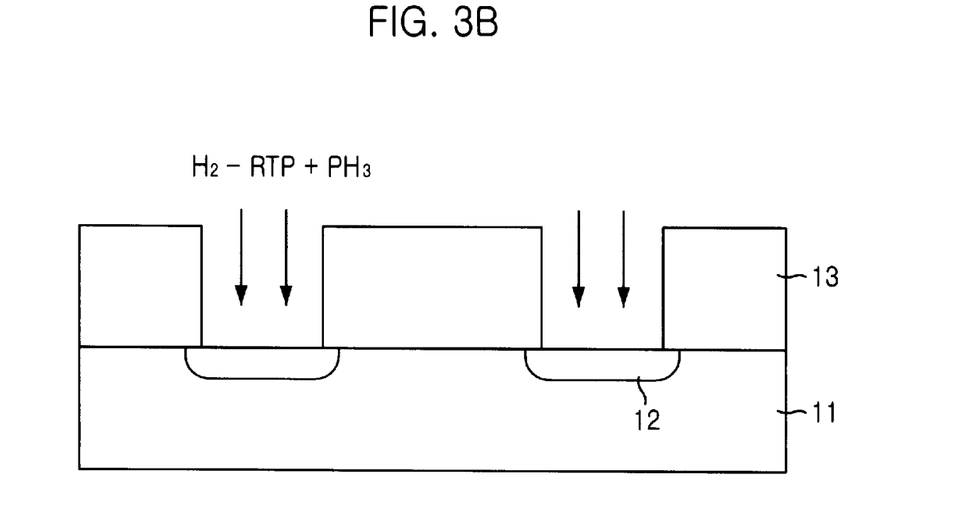
Figure 3C:
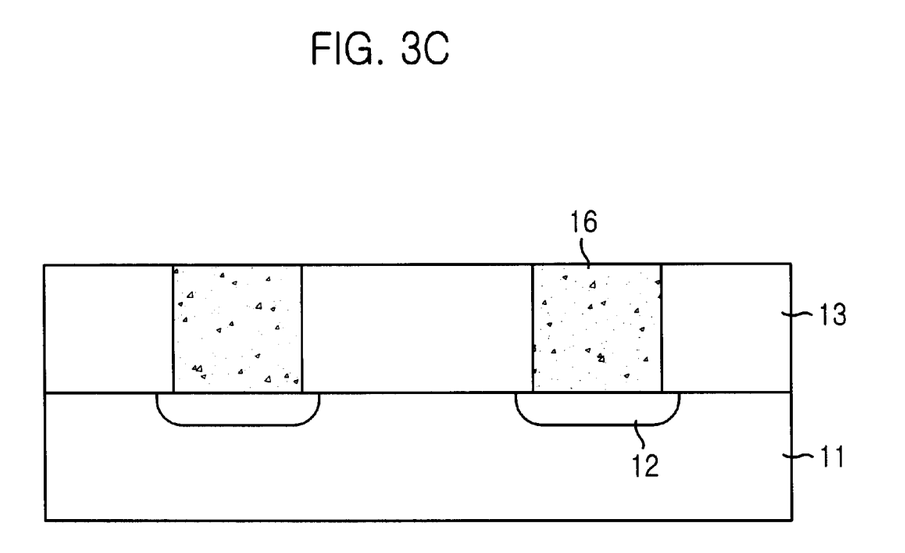

FIGS. 3A to 3C are cross-sectional views illustrating a method for forming a contact plug in a semiconductor device in accordance with a first preferred embodiment of the present invention.

Referring to FIG. 3A, an inter-layer insulating layer 13 is formed on a substrate 11 providing various elements for constituting a semiconductor device including a junction area 12. A predetermined portion of the inter-layer insulating layer 13 is then etched to form a contact hole 14 exposing the junction area 12.

At this time, a native oxide layer 15 is formed on a surface of the junction area 12 exposed when forming the contact hole 14. In addition, on the junction area 12, there present an etch damaged layer (not shown) and etch remnants (not shown) while proceeding the above etching process for forming the contact hole 14. These etch remnants and the etch damaged layer degrade leakage currents of a device. The native oxide layer 15 increases contact resistance, thereby decreasing electric properties of the device.

Prior to a removal of the native oxide layer 15, the etch remnants and the etch damaged layer are removed by using a thermal oxidation process, a $H_2$-annealing and a plasma cleaning process.

The thermal oxidation process includes steps of forming a thermal layer at a temperature-between 900° C. and about 1000° C. and removing the thermal oxidation layer through a shallow wet dip process using a HF solution diluted in a ratio of about 50 to 1. That is, the etch remnants or the etch damaged layer is consumed as the oxide layer and removed thereafter. Also, the $H_2$-annealing process is a process of applying $H_2$ at a temperature ranging from about 900° C. to about 1000° C. for about 5 minutes to about 10 minutes. The plasma cleaning process is proceeded with a low power ranging from about 1 W to about 50 W by using $NF_3$ or $SiF_6$ containing $H_2$.

By employing the above-described processes, the etch remnants and the etch damaged layer are removed. Subsequent to the etching process, a first cleaning process is performed in an ex-situ environment with use of a wet-dip before depositing a silicon plug to remove contaminants due to carbon or oxides. Hereinafter, the cleaning process performed at an ex-situ environment is called ex-situ cleaning process. A diluted solution of $H_2SO_4$ and $H_2O_2$ is applied at a temperature ranging from about 80° C. to about 120° C. for about 5 minutes to about 10 minutes. Herein, the solution of $H_2SO_4$ and $H_2O_2$ is diluted in a ratio of about 10:1–50:1. Afterwards, the HF solution diluted with $H_2O$ in a ratio of about 50:1–500:1 is applied for about 10 seconds to about 60 seconds in order to remove oxide contaminants.

After the ex-situ cleaning process, the substrate 11 is loaded to a single wafer type deposition equipment so to perform a second cleaning process in an in-situ environment. Hereinafter, this cleaning process is called in-situ cleaning process. The in-situ cleaning process is to remove the native oxide layer 15 existing on the surface of the junction area 12 by proceeding a $H_2$-rapid thermal process (RTP).

The $H_2$-RTP process for removing the native oxide layer 15 is performed by descending, i.e. cooling a temperature that has been set to rise instantaneously up to a range between 900° C. to 950° C. with a heating rate ranging from about 10° C. per second to about 100° C. per second. At this time, a flow quantity of $H_2$ is in a range between about 10 slm and about 150 slm.

When proceeding the $H_2$-RTP in an atmosphere of $H_2$, diluted $PH_3$ of which flow quantity ranging between about 30 sccm to about 500 sccm is flowed from an initial step of the $H_2$-RTP at a temperature ranging from about 900° C. to about 950° C. Flowing the Diluted $PH_3$ provides a phosphorus (P) doping effect from a surface of the substrate 11 to those layers having a thickness in a range from about 200 Å to about 500 Å.

As described the above, it is possible to offset a boron effect observed during the $H_2$-RTP by flowing the diluted $PH_3$. Also, a degree of an external phosphorus (P) effect reaching to the junction area 12 within the contact hole 14 is induced to be smaller in accordance with a cell size.

Referring to FIG. 3C, a silicon thin layer 16 is deposited in an ex-situ environment within a tube type chemical vapor deposition (CVD) equipment until completely filling the contact hole 14. The silicon thin layer 16 is indeed deposited continuously by minimizing a delaying time within a range between 0 and 3 hours after performing the $H_2$-RTP process.

Meanwhile, the silicon thin layer 16 is particularly deposited at a temperature ranging between about 510° C. to about 610° C. and a pressure ranging from about 0.1 torr to about 1 torr while providing a mixed gas obtained by adding approximately 1% of $PH_3$ to $SiH_4$ gas and $H_2$ gas. Also, a flow quantity of the $SiH_4$ gas ranges from about 200 sccm to about 2000 sccm, and that of the $H_2$ gas ranges from about 500 sccm to about 5000 sccm. The mixed gas has a flow quantity ranging from about 100 sccm to about 1000 sccm. At this time, the silicon thin layer 16 is deposited in a high concentration ranging from about $1\times10^{20}$ atoms/cm$^3$ to about $3\times10^{21}$ atoms/cm$^3$ as long as this concentration does not affect a gap fill property.

The deposition of the silicon thin layer 16 at the tube type CVD equipment improves a characteristic of step coverage further to prevent occurrence of seam or void phenomenon at the contact hole 14 having a high aspect ratio.

After depositing the silicon thin layer 16, a predetermined planarization process is performed to remove the silicon thin layer 16 existing on a top portion of the inter-layer insulating layer 13 so as to make each plug electrically independent.

Figure 4A:
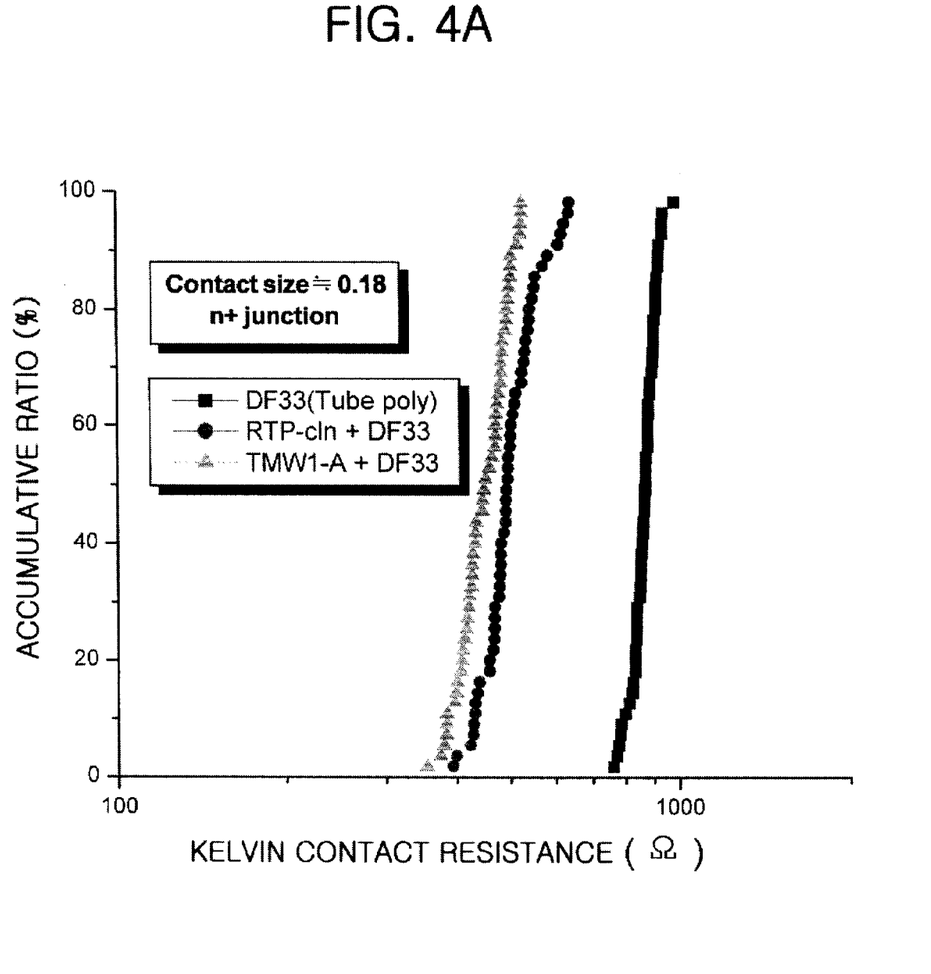
FIGS. 4A and 4B show results of analyzing contact resistance values after a hydrogen-rapid thermal process in accordance with the present invention.
Figure 4B:
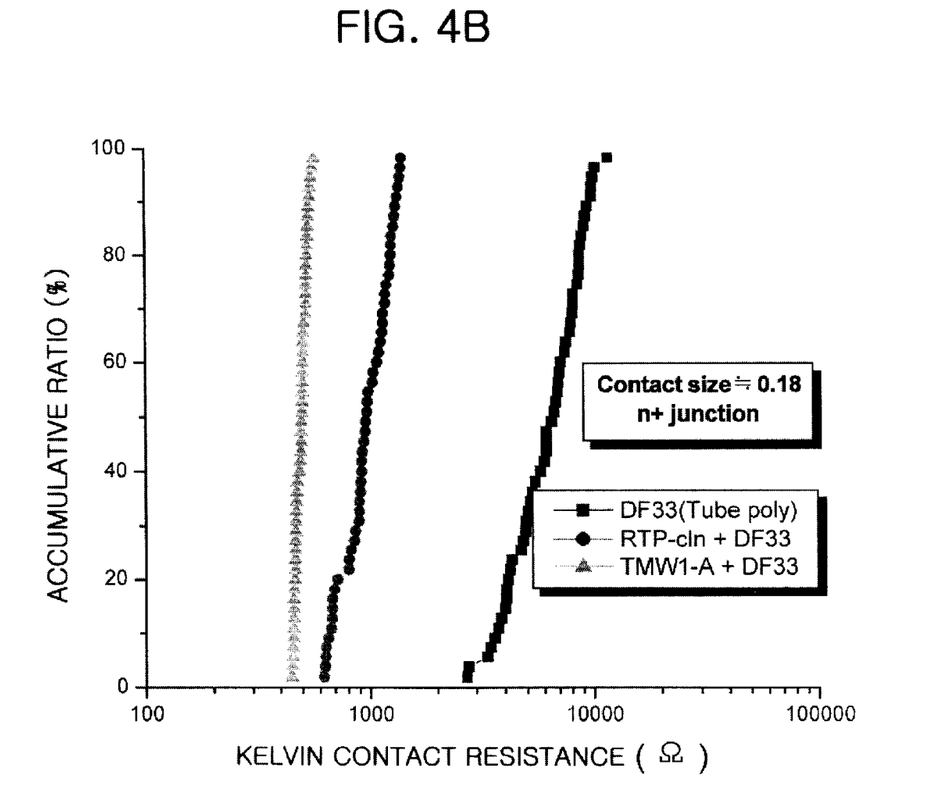

FIGS. 4A and 4B show results of analyzing contact resistance after performing the H$_2$-RTP in accordance with the present invention.

In FIG. 4A, an analysis pattern of the Kelvin contact resistance (R$_c$) is utilized to analyze resistance within the contact itself. On the other hand, an analysis pattern of chain contact resistance (R$_c$) is utilized in FIG. 4B to evaluate uniformity in the contact resistance.

FIG. 4A shows particularly the Kelvin contact resistance in case that a contact size is approximately 0.18 μm. It is shown that only an ex-situ cleaning process with a H$_2$-RTP (TMW1-A+DF33 in FIG. 4A) decreases approximately 30% to 40% of the contact resistance compared to the case of the H$_2$-RTP without the cleaning process (DF33).

FIG. 4B shows particularly the chain contact resistance in case that a contact size is approximately 0.18 μm. It is shown that a plug proceeded with the ex-situ cleaning process with the H2-RTP has a better uniformity in the contact resistance than a tube type silicon plug (DF33).

Figure 5:
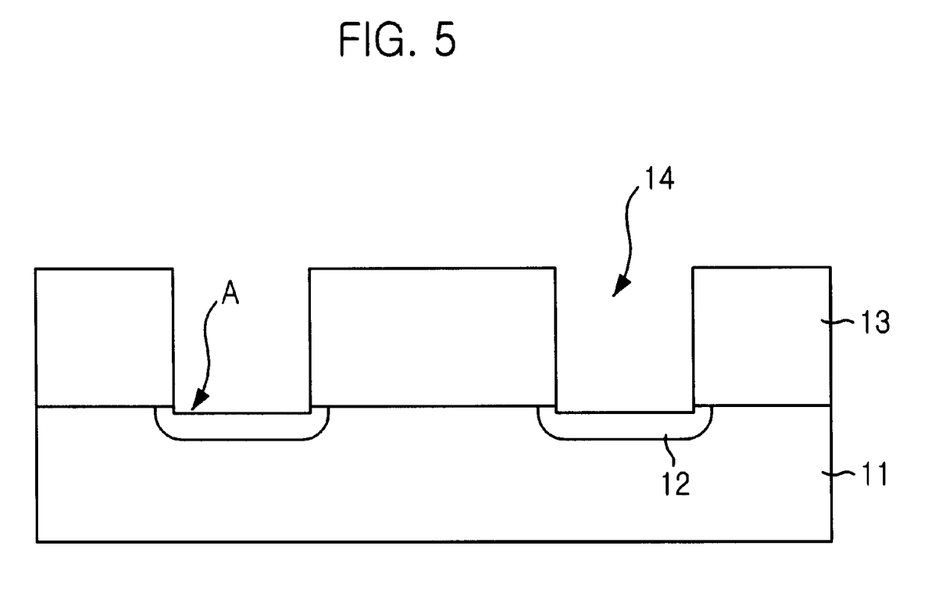
FIG. 5 is a cross-sectional view illustrating a method for forming a contact plug in accordance with a second embodiment of the present invention.

FIG. 5 is a cross-sectional view illustrating a method for forming a contact plug in accordance with a second preferred embodiment of the present invention. There is another suggested method for preventing an external diffusion effect of boron after performing the H2-RTP subsequent to the contact hole formation. That is, about 50 sccm to about 500 sccm of HCl is simultaneously flowed when cooling a temperature in approximately 950° C. after performing the H$_2$-RTP so as to remove a boron absorption layer formed through diffusions of boron to a surface of the junction area 12. Herein, the temperature, approximately 950° C., is a peak temperature of the H$_2$-RTP.

The above step of flowing the HCl has another effect of removing an etch damaged layer, thereby influencing on a decrease of the contact resistance. Therefore, the above-described method is different from the cleaning process of flowing the PH$_3$ gas since there occur losses (denoted as A in FIG. 5) on the junction area 12. At this time, amounts of the losses are controlled to be in a range from about 50 Å to about 500 Å.

In the present invention, the H$_2$-RTP is performed to prevent reformation of the native oxide layer so to minimize the contact resistance.

Also, the present invention provides an advantage of preventing degradation of a device due to less thermal loads since the present invention relates to a polysilicon process. Furthermore, the use of the tube type silicon deposition equipment prevents degradation of a step coverage characteristic, thereby improving uniformity in the contact resistance.

While the present invention has been described with respect to certain preferred embodiments, it will be apparent to those skilled in the art that various changes and modifications may be made without departing from the scope of the invention as defined in the following claims.

What is claimed is:

1. A method for forming a contact plug in a semiconductor device, comprising the steps of:
   forming a contact hole by etching an insulating layer on a substrate;
   cleaning the contact hole by employing a hydrogen-rapid thermal process (H$_2$-RTP) with flowing a gas containing phosphorus; and
   filling the contact hole with a silicon layer.

2. The method as recited in claim 1, wherein the step of cleaning the contact hole is proceeded by cooling a temperature that has been rise instantaneously up to a range between about 900° C. and 950° C. with a heating rate ranging from about 10° C. per second to about 100° C. per second in an atmosphere of H$_2$.

3. The method as recited in claim 1, wherein the gas containing phosphorus includes a PH$_3$ gas diluted in H$_2$ with a ratio bout 1% to about 10%.

4. The method as recited in claim 1, wherein the PH$_3$ gas is flowed with a quantity ranging from about 30 sccm to about 500 sccm up to a temperature ranging between about 900° C. and about 950° C.

5. The method as recited in claim 1, wherein the silicon thin layer is formed within a tube type chemical vapor deposition equipment.

6. The method as recited in claim 1, wherein the silicon thin layer is deposited at a temperature ranging from about 510° C. to 610° C. and a pressure ranging from about 0.1 torr to about 1 torr as supplying a mixed gas of SiH$_4$ gas, H$_2$ gas and PH$_3$ gas diluted in the H$_2$ gate with a ration of about 1%.

7. The method as recited in claim 6, wherein the SiH$_4$ gas has a flow quantity ranging from about 200 sccm to about 2000 sccm, the H2 gas has a flow quantity ranging from about 500 sccm to about 5000 sccm and the mixed gas has a flow quantity ranging from about 100 sccm to about 1000 sccm.

8. The method as recited in claim 1, wherein the silicon thin layer has a concentration in a range between about $1\times10^{20}$ atoms/cm$^3$ and about $3\times10^{21}$ atoms/cm$^3$.

9. The method as recited in claim 1, further comprising the step of performing a wet cleaning process in an ex-situ environment.

10. A method forming a contact plug in a semiconductor device, comprising the steps of:
    forming a contact hole by etching an insulating layer on a substrate;
    cleaning the contact hole with a hydrogen-rapid thermal process (H$_2$-RTP) and simultaneously flowing HCl gas from a peak temperature of the H$_2$-RTP; and
    forming a silicon thin layer on the substrate until filling the cleaned contact hole.

11. The method as recited in claim 10, wherein the HCl is flowed with a quantity ranging from about 50 sccm to about 500 sccm.

12. The method as recited in claim 10, wherein the insulating layer is an oxide layer containing boron and phosphorus.

* * * * *